United States Patent
Glaser et al.

(10) Patent No.: US 8,896,182 B2
(45) Date of Patent: Nov. 25, 2014

(54) SYSTEM FOR DRIVING A PIEZOELECTRIC LOAD AND METHOD OF MAKING SAME

(75) Inventors: John Stanley Glaser, Niskayuna, NY (US); Ramanujam Ramabhadran, Niskayuna, NY (US)

(73) Assignee: General Electric Corporation, Schenectady, NY (US)

( * ) Notice: Subject to any disclaimer, the term of this patent is extended or adjusted under 35 U.S.C. 154(b) by 232 days.

(21) Appl. No.: 13/440,110

(22) Filed: Apr. 5, 2012

(65) Prior Publication Data
US 2013/0264909 A1  Oct. 10, 2013

(51) Int. Cl.
*H02N 2/06* (2006.01)
*H02N 2/00* (2006.01)

(52) U.S. Cl.
CPC .................... *H02N 2/0075* (2013.01)
USPC ......................................... 310/317

(58) Field of Classification Search
CPC ...... H01L 41/042; H02N 2/0075; H02N 2/06; H02N 2/14
USPC .................................. 310/314, 317
See application file for complete search history.

(56) References Cited

U.S. PATENT DOCUMENTS

| | | | |
|---|---|---|---|
| 5,479,062 A * | 12/1995 | Yoshino | 310/316.03 |
| 5,563,464 A * | 10/1996 | Okubu et al. | 310/316.02 |
| 7,915,944 B2 | 3/2011 | Caiafa et al. | |
| 7,924,580 B2 | 4/2011 | Glaser et al. | |
| 7,929,325 B2 | 4/2011 | de Rooij et al. | |
| 8,023,296 B2 | 9/2011 | Tao et al. | |
| 8,023,297 B2 | 9/2011 | de Rooij et al. | |
| 2003/0111933 A1* | 6/2003 | Gallmeyer | 310/317 |
| 2003/0164658 A1* | 9/2003 | Saraf | 310/317 |

* cited by examiner

*Primary Examiner* — Derek Rosenau
(74) *Attorney, Agent, or Firm* — Ziolkowski Patent Solutions Group, SC; Jean K. Testa (57) ABSTRACT

A driver system comprises a direct current (DC) voltage source and a first bi-directional DC-to-DC converter having a primary side coupled to the DC voltage source and a secondary side and configured to convert a first voltage on the primary side to a second voltage on the secondary. The driver system also comprises a second bi-directional DC-to-DC converter having a primary side coupled to the DC voltage source and a secondary side coupled to the secondary side of the first bi-directional DC-to-DC converter and configured to convert the first voltage on the primary side to a third voltage on the secondary. The first and second bi-directional DC-to-DC converters are capable of boosting the first voltage, and the second control signal is a complement of the first control signal. A voltage difference between the second and third voltages comprises an output voltage that comprises an amplification of the first control signal.

22 Claims, 5 Drawing Sheets

SYSTEM FOR DRIVING A PIEZOELECTRIC LOAD AND METHOD OF MAKING SAME

BACKGROUND OF THE INVENTION

Embodiments of the invention relate generally to piezoelectric actuators and, more particularly, to a driver circuit for piezoelectric actuators.

Piezoelectric materials are known to change dimensions upon application of an electric field. This phenomenon allows the use of piezoelectric materials to be used as actuators in micro-electro-mechanical system (MEMS) devices. For example, such actuators have been used in synthetic jet actuators that generate a synthetic jet of fluid to influence the flow of that fluid over a surface. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, piezoelectric actuators often require voltages in the tens of volts or higher for proper operation, and some classes of actuators require AC voltages of possibly variable frequency and amplitude. In applications where piezoelectric actuators are interfaced with low voltage circuitry such as in portable, consumer, aviation, or transportation electronic devices, it can be difficult to drive these actuators. For example, when trying to drive a piezoelectric actuator with an AC voltage waveform or one with variable value with peak voltages higher than are available from a power source, known methods often accomplish this goal using complex, inefficient, large, and/or expensive drivers. In addition, many applications where piezoelectric actuators are used call for using minimum power consumption, and inefficient piezoelectric actuator drivers having low efficiencies often fail such minimum power consumption requirements.

Accordingly, there is a need for a system for driving a piezoelectric load so as to provide a highly efficient driver circuit that can operate from a low voltage source and efficiently generate a controllable high voltage AC waveform of variable frequency and amplitude.

BRIEF DESCRIPTION OF THE INVENTION

In accordance with one aspect of the invention, a driver system comprises a direct current (DC) voltage source and a first bi-directional DC-to-DC converter having a primary side coupled to the DC voltage source and a secondary side and comprising a control input configured to receive a first control signal configured to control conversion of a first voltage on the primary side of the first bi-directional DC-to-DC converter to a second voltage on the secondary side of the first bi-directional DC-to-DC converter. The driver system also comprises a second bi-directional DC-to-DC converter having a primary side coupled to the DC voltage source and a secondary side coupled to the secondary side of the first bi-directional DC-to-DC converter and comprising a control input configured to receive a second control signal configured to control conversion of the first voltage on the primary side of the second bi-directional DC-to-DC converter to a third voltage on the secondary side of the second bi-directional DC-to-DC converter. The first and second bi-directional DC-to-DC converters are capable of boosting the first voltage, and the second control signal is a complement of the first control signal. A voltage difference between the second and third voltages comprises an output voltage, and the output voltage comprises an amplification of the first control signal.

In accordance with another aspect of the invention, a method of manufacturing a piezoelectric driver comprises coupling a direct current (DC) voltage source to a low-voltage side of a first voltage converter and to a low-voltage side of a second voltage converter, wherein the first and second voltage converters comprise bi-directional DC-to-DC voltage converters capable of boosting a voltage from the DC voltage source. The method also comprises coupling a first high-voltage side terminal on a high-voltage side of the first voltage converter to a first side of a piezoelectric actuator, coupling a first high-voltage side terminal on a high-voltage side of the second voltage converter to a second side of the piezoelectric actuator, and coupling a second high-voltage side terminal of the first voltage converter to a second high-voltage side terminal of the second voltage converter. The method also comprises coupling a control system to the first and second voltage converters and configuring the control system to supply a first control signal to the first voltage converter and to supply a second control signal to the second voltage converter. The first control signal is configured to control the first voltage converter to convert the voltage from the DC voltage source on the low-voltage side of the first voltage converter to a first output voltage on the high-voltage side of the first voltage converter, and the second control signal is a complement of the first control signal and is configured to control the second voltage converter to convert the voltage from the DC voltage source on the low-voltage side of the second voltage converter to a second output voltage on the high-voltage side of the second voltage converter. A voltage difference between the first and second output voltages comprises a difference voltage that comprises an amplification of the first control signal.

In accordance with yet another aspect of the invention, a piezoelectric driver comprises a first bi-directional DC-to-DC voltage converter having a low-voltage side and a high-voltage side and comprises a second bi-directional DC-to-DC voltage converter having a low-voltage side and a high-voltage side. The first bi-directional DC-to-DC voltage converter comprises a first high-voltage side terminal, a second high-voltage side terminal, and wherein the first bi-directional DC-to-DC converter is capable of boosting a voltage on the first high-voltage side terminal thereof. The second bi-directional DC-to-DC voltage converter comprises a first high-voltage side terminal, a second high-voltage side terminal coupled to the second high-voltage side terminal of the first voltage converter, and wherein the second bi-directional DC-to-DC converter is capable of boosting a voltage on the first high-voltage side terminal thereof. The piezoelectric driver also comprises a direct current (DC) voltage source coupled to the low-voltage sides of the first and second bi-directional DC-to-DC voltage converters, a piezoelectric actuator coupled to the first high-voltage side terminal of the first bi-directional DC-to-DC voltage converter and coupled to the first high-voltage side terminal of the second bi-directional DC-to-DC voltage converter, and a control system coupled to the first and second voltage converters. The control system is configured to supply a first control signal to the first bi-directional DC-to-DC voltage converter, wherein the first control signal is configured to control the first bi-directional DC-to-DC voltage converter to convert a voltage on the low-voltage side of the first bi-directional DC-to-DC voltage converter to a first output voltage on the high-voltage side of the first bi-directional DC-to-DC voltage converter. The control system is also configured to supply a second control signal to the second bi-directional DC-to-DC voltage converter, wherein the second control signal is a complement of the first control signal and is configured to control the second bi-directional DC-to-DC voltage converter to convert a voltage on the low-voltage side of the second bi-directional DC-to-DC voltage converter to a second output voltage on the high-voltage side of the second bi-directional DC-to-DC voltage converter. A voltage difference between the first and second output voltages comprises a difference voltage that comprises an amplification of the first control signal.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Figure 1:
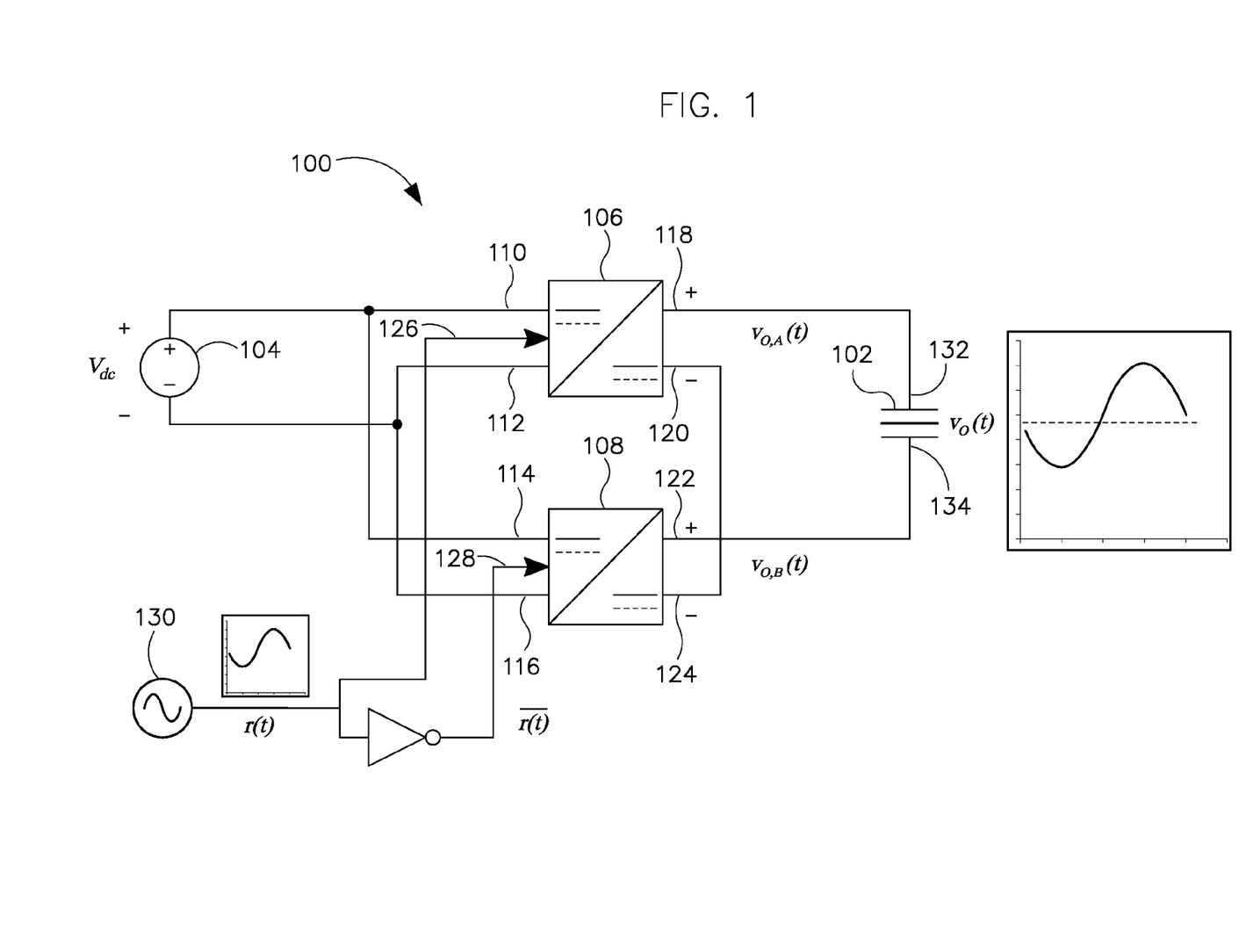
FIG. 1 is a block schematic diagram illustrating a piezoelectric driver for a piezoelectric load according to an embodiment of the invention.

Referring to FIG. 1, a block schematic diagram illustrates a piezoelectric driver 100 coupled to a piezoelectric load or actuator 102. Piezoelectric load 102 is a capacitive or reactive load.

Piezoelectric driver 100 includes a voltage source 104 and first and second converters 106, 108. First and second converters 106, 108 are DC-TO-DC bi-directional converters/amplifiers configured to take a voltage from voltage source 104 supplied to respective pairs of low-side converter terminals 110, 112 and 114, 116 and to boost the supplied voltage to respective pairs of high-side converter terminals 118, 120 and 122, 124. First and second converters 106, 108 also buck voltages from respective terminals 118, 120 and 122, 124 to respective terminals 110, 112 and 114, 116. First converter 106 is configured to convert the voltage, $v_{dc}$, from voltage source 104 to an output voltage, $v_{OA}$, and second converter 108 is configured to convert the voltage, $v_{dc}$, from voltage source 104 to an output voltage,. In one embodiment, output voltages $v_{OA}$ and $v_{OB}$ are non-linear amplifications of the voltage, $v_{dc}$. However, the difference between voltages $v_{OA}$ and $v_{OB}$ is an approximately linear scaled or boosted version of voltage, $v_{dc}$.

In one embodiment, first and second converters 106, 108 substantially identical single-stage bi-directional switch-mode power converters. As used herein, a single-stage converter is a converter that converts an input voltage to an output voltage in a single stage without converting the input voltage to an intermediate voltage prior to the output voltage.

First and second converters 106, 108 buck or boost voltages based on a pair of control inputs 126, 128 supplied by an AC voltage source 130 that generates a reference signal, r(t), of which an amplified version is intended to drive piezoelectric load 102, is supplied to control input 126. A reference signal, $\overline{r(t)}$, which is a complement of reference signal, r(t), is supplied to control input 128.

Converter terminal 118 of first converter 106 is coupled to a first terminal 132 of piezoelectric load 102, and converter terminal 122 of second converter 108 is coupled to a second terminal 134 of piezoelectric load 102. Further, converter terminal 120 is coupled to converter terminal 124. In this configuration, converter terminals 118-124 drive piezoelectric load 102 differentially. As illustrated in FIG. 1, output voltages $v_{OA}$ and $v_{OB}$ of converters 106, 108, respectively, are supplied to piezoelectric load 102, which sees a voltage across terminals 132, 134 as $v_O = v_{OA} - v_{OB}$. Often, it is desired that $v_O = k*r(t)$, where k equals a constant gain. In this manner, the output voltage, $v_O$, substantially equals a constant gain times the reference signal.

At many frequencies, the impedance of a piezoelectric load such as actuator 102 has a substantial reactive component. As such, under an AC drive condition, power will flow in and out of the load each AC cycle. Accordingly, first and second converters 106, 108 are bi-directional converters, as stated above, so as to accommodate this bi-directional power flow.

Figure 2:
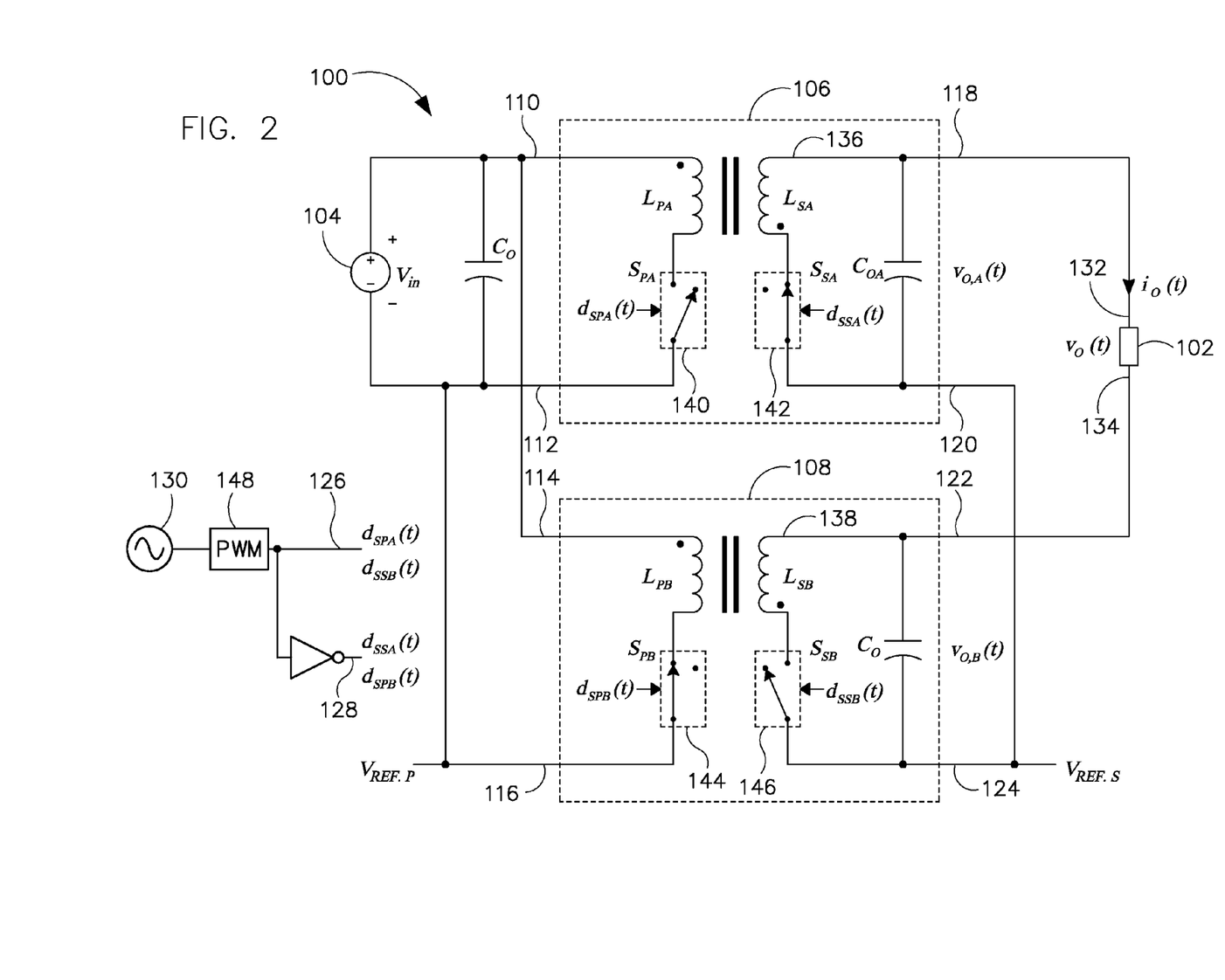
FIG. 2 is a schematic diagram illustrating a piezoelectric driver circuit for a piezoelectric load according to an embodiment of the invention.

While first and second converters 106, 108 may be any kind of bi-directional converter capable of boosting and bucking voltage, FIG. 2 illustrates a bi-directional fly-back buck/boost converter embodiment according to an embodiment of the invention. Such fly-back converters are suitable for when large voltage boosts are needed and/or when isolation is needed. Embodiments of the invention also contemplate, however, that variations on converters, such as soft-switching or active clamping to reduce switching losses, can also be used with the circuits described herein.

As shown, first and second converters 106, 108 include transformers 136, 138 and switches 140, 142 and 144, 146, respectively. Switches 140-146 are power switches and may be, for example, MOSFETs, IGBTs, SCRs, and other power switches known in the art.

In one embodiment, a pulse-width modulator (PWM) 148 is controlled to provide an AC or sinusoidal reference signal r(t) to control the conversion process in converters 106, 108. Control input 126 of PWM 148 is tied to switches 140, 146 and is configured to deliver control signals $d_{SPA}(t)$ and $d_{SSB}(t)$ thereto. Control input 128, which is the converse of control input 126, is tied to switches 142, 144 and is configured to deliver control signals $d_{SPB}(t)$ and $d_{SSA}(t)$ thereto. In one exemplary case, $d_{SPA}(t) = d_{SBB}(t) = k1*r(t)$, and $d_{SPB}(t) = d_{SBA}(t) = 1 - k1*r(t)$, where the $d_x(t)$ are switch duty cycles, k1 is a constant, and r(t) is a reference signal.

A pair of nodes $V_{REF,P}$ and $V_{REF,S}$ are respectively formed on a primary (P) side and a secondary (S) side of piezoelectric driver 100. Nodes $V_{REF,P}$ and $V_{REF,S}$ may be coupled to respective ground planes, for example, or maybe coupled together via a single ground plane. Coupling nodes $V_{REF,P}$ and $V_{REF,S}$ together via a single ground plane may help to reduce construction costs of piezoelectric driver 100 as well as to simplify the driving of piezoelectric load 102. When coupled to a common single ground plane, converter terminals 120 and 124 are coupled to converter terminal 112 and 116.

Figure 3:
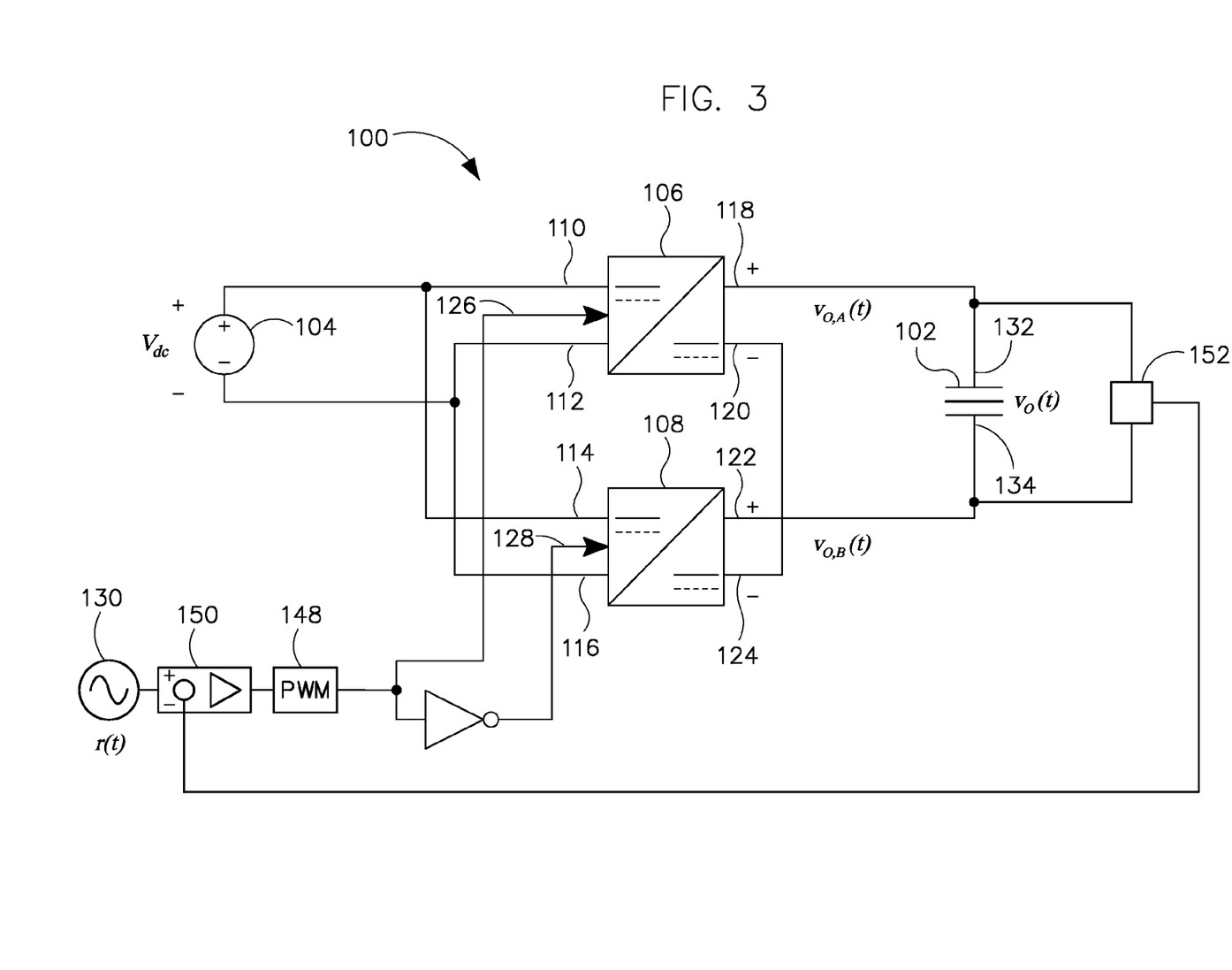
FIG. 3 is a block schematic diagram illustrating a piezoelectric driver according to another embodiment of the invention.

In cases where the control-to-output function of first and second converters 106, 108 is not linear or is not an acceptable approximation of linear, error correction or reduction methods may be used to correct the output of first and second converters 106, 108 such that a more linear output is approximated. FIG. 3 illustrates a block schematic diagram showing an example of using feedback as a method of error correction according to an embodiment of the invention. FIG. 3 illustrates components of the piezoelectric driver 100 of FIG. 1 together with PWM 148 of FIG. 2. A compensator 150 is also shown coupled between AC voltage source 130 and PWM 148. Compensator 150 receives the output voltage $v_o(t)$ as measured across piezoelectric load 102 via a voltage sensor 152. The actual output waveform voltage $v_o(t)$ received from voltage sensor 152 is used to modify the input waveform voltage r(t) such that PWM control of first and second converters 106, 108 based on the modified input waveform voltage produces a desired output voltage waveform. In this manner, the input waveform voltage r(t) is modified using feedback to control first and second converters 106, 108 to approximate a linear conversion throughout a broad conversion range.

Figure 4:
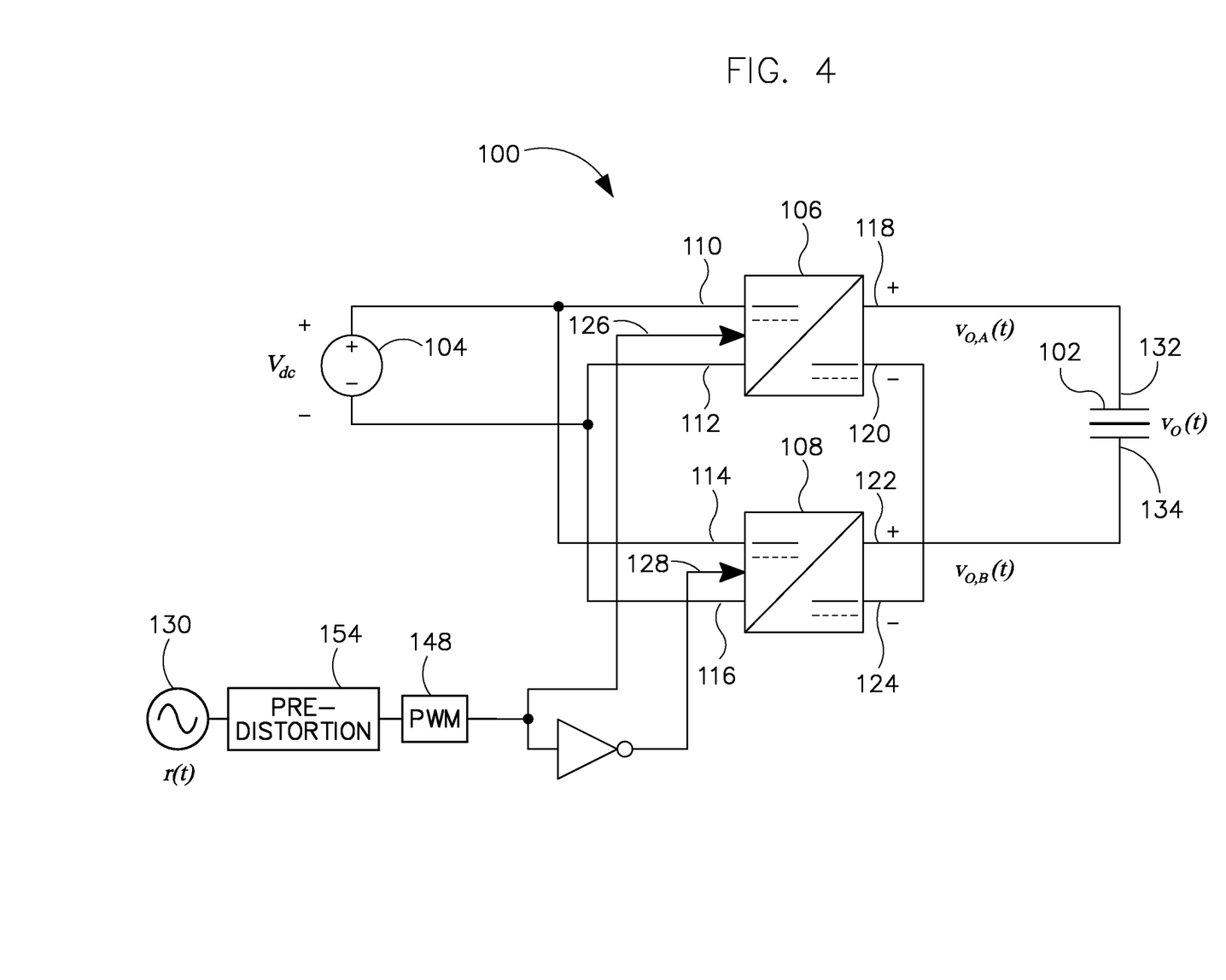
FIG. 4 is a block schematic diagram illustrating a piezoelectric driver according to another embodiment of the invention.

FIG. 4 illustrates a block schematic diagram showing an example of using pre-distortion as a method of error correction according to another embodiment of the invention. FIG. 4 illustrates components of the piezoelectric driver 100 of FIG. 1 together with PWM 148 of FIG. 2. A pre-distortion block 154 is also shown coupled between AC voltage source 130 and PWM 148. Pre-distortion 154 may be performed using a controller or other hardware components configured to modify the input waveform voltage r(t) such that PWM control of first and second converters 106, 108 based on the modified input waveform voltage produces a desired output voltage waveform $v_o(t)$. For example, the pre-distortion controller may be programmed with a look-up table or with a pre-distortion algorithm configured to distort the input waveform voltage r(t) based on a known boost conversion function behavior of first and second converters 106, 108 when controlled by the input waveform voltage r(t) throughout its waveform range. In this manner, the input waveform voltage r(t) is modified using predetermined distortion modifications to control first and second converters 106, 108 to approximate a linear conversion throughout a broad conversion range.

Figure 5:
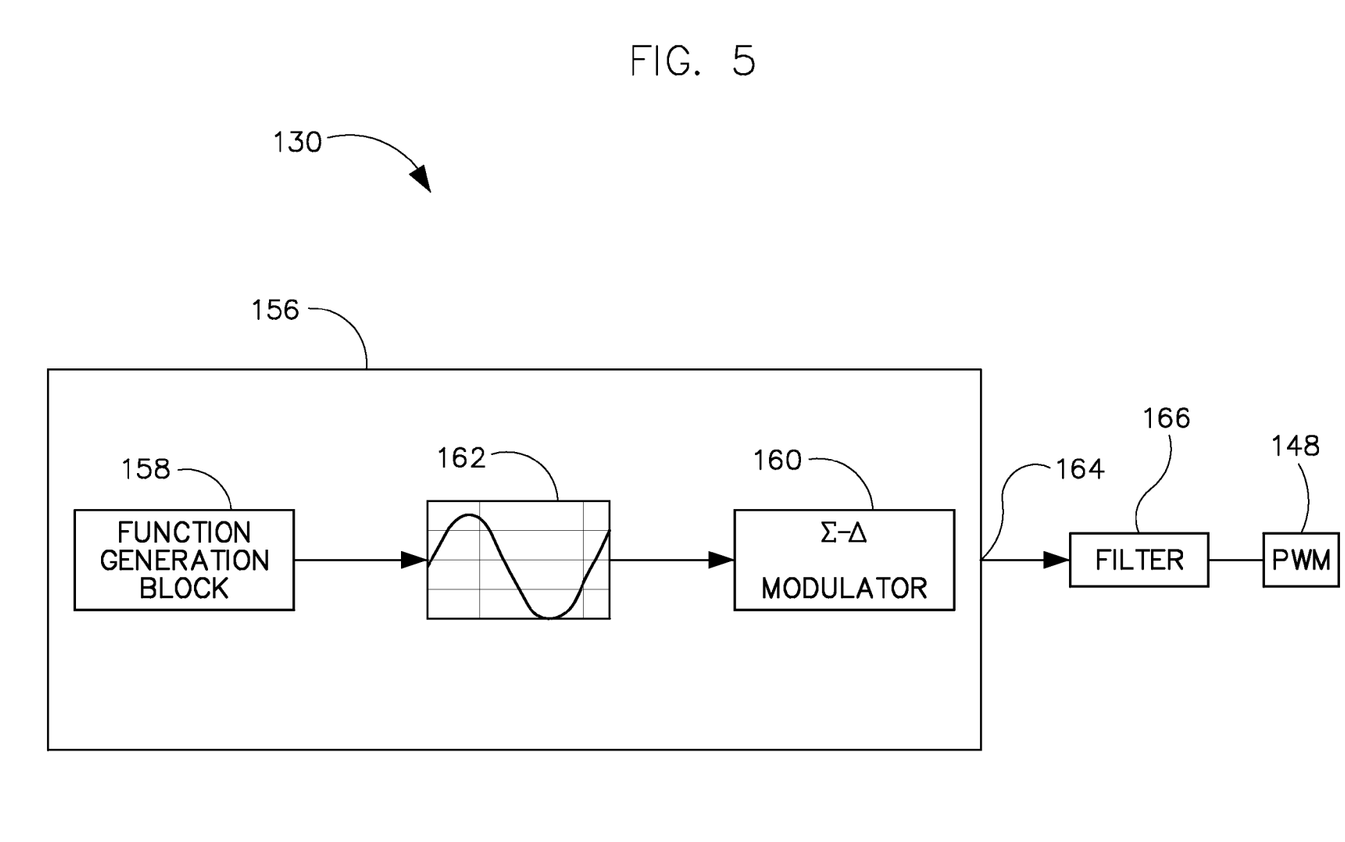
FIG. 5 is a block schematic diagram illustrating a reference signal generator according to an embodiment of the invention.

FIG. 5 shows a block schematic diagram showing an example of source 130 that generates reference signal, r(t), illustrated in FIGS. 1-4 according to an embodiment of the invention. Generation of r(t) in this manner can produce a high fidelity at the piezoelectric driver output.

The generation of the reference signal r(t) may be accomplished using an analog circuit or a digital implementation to synthesize the reference signal r(t). In simple cases, the generation of the reference signal r(t) can be done in an analog circuit. For example, the generation of a sine wave may be accomplished with a Wein Bridge or similar oscillator. However, to generate more complex patterns, or to compensate for nonlinear effects and distortion introduced by the converters, a digital implementation is more convenient. Single board computers such as FPGAs, DSPs, or microcontrollers can be used for this purpose. In digital implementations, pre-distortion such as that described in FIG. 4 can also be included.

FIG. 5 illustrates a controller 156 used to generate a specified command signal that can drive PWM 148. Controller 156 includes a function generation block 158 and a Σ-Δ (Sigma Delta) modulator block 160. In the function generation block 158, the desired waveform can be programmed as a function or as a look-up table. For example, a function generator may execute an algorithm to determine the digital values to use. Alternatively, the look-up table may have the digital values pre-calculated and stored therein. A digital controller or DSP (not shown) can take these digital values and further generate reference signal r(t) according to a variety of ways. In one embodiment, the digital values can be fed to a Digital to Analog Converter (DAC) 162 that generates an analog waveform. In another embodiment, the digital values can drive a pulse width modulator (not shown) internal to the digital controller 156 whose output is subsequently filtered through filters (not shown) to remove unwanted frequency components. In yet another embodiment, the digital values can drive digital PWM 148 that directly generates the power switch control waveforms.

Due to "quantization" when using digital waveform generation methods, the number of bits available in low cost microcontrollers is typically limited and usually means that there are "steps" or quanta visible in the reference waveform construction. These artifacts can be manifested as distortion or low fidelity waveforms at the output 164 of the controller 156. In some cases, these artifacts can result in undesirable behavior such as, for example, the generation of audible noise. Since the fundamental analog waveform can be of low frequency, removing these artifacts usually involves filtering higher order harmonics using bulky filters at the output 164. A filter block 166 is included as an interface between the controller 156 and the PWM 148. If nothing is done to address the quantization effects described above, heavy low pass filtering may be used to ensure that the quantization effects do not affect the output of the driver and converters. If the controller 156 has lower resolution, the cutoff frequency of the filters would be low enough that the reference signal r(t) may be attenuated. Compensating for this effect could entail a boost in power consumption.

When pre-distortion is employed, a low pass filter with a cutoff frequency close to the fundamental can cause inaccurate scaled representation of r(t) in first and second converters 106, 108. For example, since the output signal desired from the converters 106, 108 is a scaled representation of r(t), if converters 106, 108 are nonlinear, r(t) may be pre-distorted before being input to the PWM 148 as a signal r'(t) in a manner that compensates for the nonlinear behavior of the converters 106, 108. The pre-distorted signal r'(t) would modify the harmonics of r(t). If low pass filtering attenuates these harmonics or changes their phase relative to each other and to the fundamental, an undesired distortion will be added, and the output of converters 106, 108 will no longer be an accurate scaled representation of reference signal r(t).

To avoid the filtering constraints and to mitigate the quantization related effects, an increase in effective sampling resolution is used. Sigma Delta techniques can be implemented in the controller 156 to increase the resolution and reduce the impact of quantization. If the controller 156 has a sufficiently high sampling rate, the higher sampling and computation rates of the controller 156 can be traded off against the frequency components of the reference signal r(t) to oversample the signal. This can also be implemented as a look-up table, where the reference signal r(t) is oversampled and the entries are programmed as the look-up table in the controller 156.

An advantage of such oversampling is that any resulting inaccuracies or distortion in the sampled waveform is now dependent on the frequency at which the signal is oversampled or overrepresented. The artifacts that previously arose from quantization are now shifted to higher frequencies. This allows the filtering to be implemented on the analog waveform as it comes out of the controller 156 with a higher cutoff frequency than possible with a conventional DAC since the sigma delta technique 160 shifts the artifact frequencies to a value much higher than the fundamental reference component. This has at least two benefits. First, the size and cost of the filter can be reduced. Second, the higher filter cutoff frequency made possible means that the filter's effect on harmonic components generated or modified by pre-distortion will be minimized, making the use of pre-distortion practical.

This method of generating a clean command to the PWM 148 is important to maintaining the fidelity of the output waveform $v_0(t)$. Indeed, in some implementations, the entire chain can be implemented in a microcontroller block or digital processor, including the filter 166 and PWM 148 as well.

Embodiments of the invention allow for a piezoelectric driver that has high efficiency, low cost, small size, and good waveform fidelity. In addition, using fly-back converters such as those described with respect to FIG. 2 in some embodiments allows galvanic isolation, a wide voltage range, and a common reference ground for all power switches. Further, compensating for non-linear DC-TO-DC conversion using feedback, pre-distortion, or other error correction techniques such as a feed-forward error correction technique allow the voltage across the piezoelectric actuator to be a linear approximation of the control signals used to control the boost conversion process.

Therefore, in accordance with one embodiment of the invention, a driver system comprises a direct current (DC) voltage source and a first bi-directional DC-to-DC converter having a primary side coupled to the DC voltage source and a secondary side and comprising a control input configured to receive a first control signal configured to control conversion of a first voltage on the primary side of the first bi-directional DC-to-DC converter to a second voltage on the secondary side of the first bi-directional DC-to-DC converter. The driver system also comprises a second bi-directional DC-to-DC converter having a primary side coupled to the DC voltage source and a secondary side coupled to the secondary side of the first bi-directional DC-to-DC converter and comprising a control input configured to receive a second control signal configured to control conversion of the first voltage on the primary side of the second bi-directional DC-to-DC converter to a third voltage on the secondary side of the second bi-directional DC-to-DC converter. The first and second bi-directional DC-to-DC converters are capable of boosting the first voltage, and the second control signal is a complement of the first control signal. A voltage difference between the second and third voltages comprises an output voltage, and the output voltage comprises an amplification of the first control signal.

In accordance with another embodiment of the invention, a method of manufacturing a piezoelectric driver comprises coupling a direct current (DC) voltage source to a low-voltage side of a first voltage converter and to a low-voltage side of a second voltage converter, wherein the first and second voltage converters comprise bi-directional DC-to-DC voltage converters capable of boosting a voltage from the DC voltage source. The method also comprises coupling a first high-voltage side terminal on a high-voltage side of the first voltage converter to a first side of a piezoelectric actuator, coupling a first high-voltage side terminal on a high-voltage side of the second voltage converter to a second side of the piezoelectric actuator, and coupling a second high-voltage side terminal of the first voltage converter to a second high-voltage side terminal of the second voltage converter. The method also comprises coupling a control system to the first and second voltage converters and configuring the control system to supply a first control signal to the first voltage converter and to supply a second control signal to the second voltage converter. The first control signal is configured to control the first voltage converter to convert the voltage from the DC voltage source on the low-voltage side of the first voltage converter to a first output voltage on the high-voltage side of the first voltage converter, and the second control signal is a complement of the first control signal and is configured to control the second voltage converter to convert the voltage from the DC voltage source on the low-voltage side of the second voltage converter to a second output voltage on the high-voltage side of the second voltage converter. A voltage difference between the first and second output voltages comprises a difference voltage that comprises an amplification of the first control signal.

In accordance with yet another embodiment of the invention, a piezoelectric driver comprises a first bi-directional DC-to-DC voltage converter having a low-voltage side and a high-voltage side and comprises a second bi-directional DC-to-DC voltage converter having a low-voltage side and a high-voltage side. The first bi-directional DC-to-DC voltage converter comprises a first high-voltage side terminal, a second high-voltage side terminal, and wherein the first bi-directional DC-to-DC converter is capable of boosting a voltage on the first high-voltage side terminal thereof. The second bi-directional DC-to-DC voltage converter comprises a first high-voltage side terminal, a second high-voltage side terminal coupled to the second high-voltage side terminal of the first voltage converter, and wherein the second bi-directional DC-to-DC converter is capable of boosting a voltage on the first high-voltage side terminal thereof. The piezoelectric driver also comprises a direct current (DC) voltage source coupled to the low-voltage sides of the first and second bi-directional DC-to-DC voltage converters, a piezoelectric actuator coupled to the first high-voltage side terminal of the first bi-directional DC-to-DC voltage converter and coupled to the first high-voltage side terminal of the second bi-directional DC-to-DC voltage converter, and a control system coupled to the first and second voltage converters. The control system is configured to supply a first control signal to the first bi-directional DC-to-DC voltage converter, wherein the first control signal is configured to control the first bi-directional DC-to-DC voltage converter to convert a voltage on the low-voltage side of the first bi-directional DC-to-DC voltage converter to a first output voltage on the high-voltage side of the first bi-directional DC-to-DC voltage converter. The control system is also configured to supply a second control signal to the second bi-directional DC-to-DC voltage converter, wherein the second control signal is a complement of the first control signal and is configured to control the second bi-directional DC-to-DC voltage converter to convert a voltage on the low-voltage side of the second bi-directional DC-to-DC voltage converter to a second output voltage on the high-voltage side of the second bi-directional DC-to-DC voltage converter. A voltage difference between the first and second output voltages comprises a difference voltage that comprises an amplification of the first control signal.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A driver system comprising:
   a direct current (DC) voltage source;
   a first bi-directional DC-to-DC converter having a primary side coupled to the DC voltage source and a secondary side and comprising a control input configured to receive a first control signal configured to control conversion of a first voltage on the primary side of the first bi-directional DC-to-DC converter to a second voltage on the secondary side of the first bi-directional DC-to-DC converter;
   a second bi-directional DC-to-DC converter having a primary side coupled to the DC voltage source and a secondary side coupled to the secondary side of the first bi-directional DC-to-DC converter and comprising a control input configured to receive a second control signal configured to control conversion of the first voltage on the primary side of the second bi-directional DC-to-DC converter to a third voltage on the secondary side of the second bi-directional DC-to-DC converter;
   wherein the first and second bi-directional DC-to-DC converters are capable of boosting the first voltage;
   wherein the second control signal is a complement of the first control signal;
   wherein a voltage difference between the second and third voltages comprises an output voltage;
   wherein the output voltage comprises an amplification of the first control signal;
   a control system coupled to the first and second bi-directional DC-to-DC converters and configured to:
      generate the first and second control signals based on a reference signal generated by an alternating current (AC) voltage source; and
      supply the first and second control signals to the first and second bi-directional DC-to-DC converters, respectively.

2. The driver system of claim 1 further comprising a reactive load having a first terminal and a second terminal;
   wherein the first bi-directional DC-to-DC converter comprises:
      a first secondary-side terminal coupled to the first terminal of the reactive load; and
      a second secondary-side terminal; and
   wherein the second bi-directional DC-to-DC converter comprises:
      a first secondary-side terminal coupled to the second terminal of the reactive load; and
      a second secondary-side terminal coupled to the second secondary-side terminal of the first bi-directional DC-to-DC converter.

3. The driver system of claim 2 wherein the reactive load comprises a piezoelectric load.

4. The driver system of claim 2 wherein the first bi-directional DC-to-DC converter further comprises a pair of primary-side terminals coupled to the DC voltage source; and
   wherein the second bi-directional DC-to-DC converter further comprises a pair of primary-side terminals coupled to the DC voltage source.

5. The driver system of claim 4 wherein the second secondary-side terminal of the first bi-directional DC-to-DC converter is coupled to one of the pair of primary-side terminals of the first bi-directional DC-to-DC converter and to one of the pair of primary-side terminals of the second bi-directional DC-to-DC converter.

6. The driver system of claim 2 wherein each of the first and second bi-directional DC-to-DC converters comprises:
   a transformer comprising:
      a primary-side winding; and
      a secondary-side winding;
   a first switch coupled to the primary-side winding; and
   a second switch coupled to the secondary-side winding.

7. The driver system of claim 6 wherein the secondary-side winding of the first bi-directional DC-to-DC converter is coupled to the first terminal of the reactive load;
   wherein the secondary-side winding of the second bi-directional DC-to-DC converter is coupled to the second terminal of the reactive load; and
   wherein the second switch of the first bi-directional DC-to-DC converter is further coupled to the second switch of the second bi-directional DC-to-DC converter.

8. The driver system of claim 1 wherein the output voltage comprises a substantially linear amplification of the first control signal.

9. The driver system of claim 8 wherein the second voltage is a non-linear amplification of the first control signal; and
   wherein the third voltage is a non-linear amplification of the first control signal.

10. The driver system of claim 1 wherein the control system comprises a pulse-width modulator.

11. The driver system of claim 1 wherein the control system further comprises a feedback circuit configured to measure a feedback voltage based on the second and third voltages; and
    wherein the control system is further configured to modify the first and second control signals based on the feedback voltage such that the second and third voltages substantially match a target set of voltage values.

12. The driver system of claim 1 wherein the control system further comprises a pre-distortion controller configured to modify the first and second control signals such that the output voltage approximates a linear boost conversion of the first and second control signals.

13. The driver system of claim 1 wherein the control system further comprises a digital controller configured to generate the reference signal from a plurality of digital values determined via one of a function generator and a look-up table.

14. The driver system of claim 13 wherein the digital controller is further configured to convert the plurality of digital values to an analog signal via one of a digital to analog converter and a pulse-width modulator.

15. The driver system of claim 14 wherein the control system further comprises a filter configured to attenuate noise in the analog signal, wherein the noise is due to one of quantization and sampling.

16. The driver system of claim 14 wherein the digital controller, in being configured to convert the plurality of digital values to an analog signal, is configured to convert the plurality of digital values to an analog signal via a Sigma Delta modulator.

17. The driver system of claim 14 wherein the control system further comprises a filter configured to attenuate noise in the analog signal, wherein the noise is due to one of quantization and sampling; and
    wherein the digital controller, in being configured to convert the plurality of digital values to an analog signal, is configured to convert the plurality of digital values to an analog signal via a Sigma Delta modulator.

18. The driver system of claim 1 wherein the first and second bi-directional DC-to-DC converters comprise single-stage converters.

19. A piezoelectric driver comprising:
a first bi-directional DC-to-DC voltage converter having a low-voltage side and a high-voltage side and comprising:
  a first high-voltage side terminal;
  a second high-voltage side terminal; and
  wherein the first bi-directional DC-to-DC converter is capable of boosting a voltage on the first high-voltage side terminal thereof;
a second bi-directional DC-to-DC voltage converter having a low-voltage side and a high-voltage side and comprising:
  a first high-voltage side terminal;
  a second high-voltage side terminal coupled to the second high-voltage side terminal of the first voltage converter; and
  wherein the second bi-directional DC-to-DC converter is capable of boosting a voltage on the first high-voltage side terminal thereof;
a direct current (DC) voltage source coupled to the low-voltage sides of the first and second bi-directional DC-to-DC voltage converters;
a piezoelectric actuator coupled to the first high-voltage side terminal of the first bi-directional DC-to-DC voltage converter and coupled to the first high-voltage side terminal of the second bi-directional DC-to-DC voltage converter; and
a control system coupled to the first and second voltage converters and configured to:
  supply a first control signal to the first bi-directional DC-to-DC voltage converter, wherein the first control signal is configured to control the first bi-directional DC-to-DC voltage converter to convert a voltage on the low-voltage side of the first bi-directional DC-to-DC voltage converter to a first output voltage on the high-voltage side of the first bi-directional DC-to-DC voltage converter;
  supply a second control signal to the second bi-directional DC-to-DC voltage converter, wherein the second control signal is a complement of the first control signal and is configured to control the second bi-directional DC-to-DC voltage converter to convert a voltage on the low-voltage side of the second bi-directional DC-to-DC voltage converter to a second output voltage on the high-voltage side of the second bi-directional DC-to-DC voltage converter;
  generate the first and second control signals based on a reference signal generated by an alternating current (AC) voltage source; and
  wherein a voltage difference between the first and second output voltages comprises a difference voltage that comprises an amplification of the first control signal.

20. The piezoelectric driver of claim 19 wherein each of the first and second bi-directional DC-to-DC converters comprises:
  a transformer comprising:
    a primary-side winding on the low-voltage side; and
    a secondary-side winding on the high-voltage side;
  a first switch coupled to the primary-side winding; and
  a second switch coupled to the secondary-side winding.

21. The piezoelectric driver of claim 19 further comprising:
  a feedback circuit configured to measure an output voltage based on the first high-voltage side terminals of the first and second bi-directional DC-to-DC voltage converters; and
  wherein the control system is further configured to modify the first and second control signals based on the feedback voltage such that a waveform of the output voltage substantially matches a desired waveform.

22. The piezoelectric driver of claim 19 further comprising a pre-distortion controller configured to modify the first and second control signals such that the conversion of the voltage on the low-voltage sides of the first and second bi-directional DC-to-DC voltage converters to the high-voltage side of the first and second bi-directional DC-to-DC voltage converters approximates a linear boost conversion of the first and second control signals.

\* \* \* \* \*